United States Patent [19]

Chim et al.

[11] Patent Number: 5,486,769
[45] Date of Patent: Jan. 23, 1996

[54] METHOD AND APPARATUS FOR MEASURING QUANTITATIVE VOLTAGE CONTRAST

[75] Inventors: Wai K. Chim; Jacob C. H. Phang; Daniel S. H. Chan, all of Singapore, Singapore

[73] Assignee: National University of Singapore, Crescent, Singapore

[21] Appl. No.: 290,527

[22] Filed: Aug. 15, 1994

[51] Int. Cl.[6] .................................................. G01R 31/00
[52] U.S. Cl. ..................... 324/751; 324/750; 250/310; 250/311
[58] Field of Search .................................. 324/751, 750; 250/310, 311

[56] References Cited

PUBLICATIONS

Nakamura et al., An Analysis of the Local Field Effect on Electron Probe Voltage Measurements, Scanning Electron Microscopy, 1983/III, pp. 1187–1195.
Feuerbaum, VLSI Testing Using the Electron Probe, Scanning Electron Microscopy, 1979/I, pp. 285–296.
Fujioka et al., Local Field Effects on Voltage Measurement Using a Retarding Field Analyser in the Scanning Electron Microscopy, Scanning Electron Microscopy, 1981/I, pp. 323–332.
Taylor, The effect of passivation on the observation of voltage contrast in the scanning electron microscope, vol. 11, 1978, The Institute of Physics, J. Phys. D; Appl. Phys., pp. 2443–2454.
Hardy et al., A Voltage Contrast Detector for the SEM, vol. 8, Journal of Physics E: Scientific Instruments, 1975, pp. 789–793.
Chan et al., The Influence of Analyser Geometry Effects in Scanning Electron Microscope Voltage Contrast Measurements, vol. 2, No. 3, Scanning Microscopy, 1988, pp. 1419–1426.
Chan et al., Error Voltage Components in Quantitative Voltage Contrast Measurement Systems, vol. 5, No. 2, Scanning Microscopy, 1991, pp. 345–355.
Radzimski et al., Electron beam testing of integrated circuits with multilevel metal, American Vacuum Society, J. Vac. Sci. Technol., Nov./Dec. 1990, pp. 2037–2040.

*Primary Examiner*—Kenneth A. Wieder
*Assistant Examiner*—Kourosh Cyrus Khosravi

[57] ABSTRACT

In a method and apparatus for measuring quantitative voltage contrast, an electron beam of the scanning electron microscope is located on a specimen electrode, and a grid voltage of an energy analyzer of the scanning electron microscope is varied. A detector detects secondary electron emission from the specimen electrode. A measured peak voltage of the specimen electrode is determined based on output from the detector. A specimen electrode voltage corrected for type I local field effect error is then obtained using the measured peak voltage and a type I calibration curve. The type I calibration curve represents peak voltage versus specimen electrode voltage. Type II local field effect error in the specimen electrode voltage is then corrected based on a type II calibration curve. The type II calibration curve represents a shift in specimen electrode peak voltage versus adjacent electrode voltage.

17 Claims, 11 Drawing Sheets a = ELECTRODE WIDTH
b = SEPARATION BETWEEN ELECTRODES

METHOD AND APPARATUS FOR MEASURING QUANTITATIVE VOLTAGE CONTRAST

FIELD OF THE INVENTION

The present invention relates to a method and apparatus for making, and more specifically for correcting, quantitative voltage contrast measurements (QVCM).

BACKGROUND OF INVENTION

There are known various conventional quantitative voltage contrast measurement systems for scanning electron microscopes and electron beam testing, such as that described in "An Analysis of the Local Field Effect Probe Voltage Measurements", Nakamura et al., 1993, *Scanning Electron Microscopy*, Pages 1187–1195; "VLSI Testing Using the Electron Probe", H. P. Feuerbaum, *Scanning Electron Microscopy*, 1979, pages 285–296; and "Local Field Effects on Voltage Measurement Using a Retarding Field Analyser in the Scanning Electron Microscopy", Fujioka et al., *Scanning Electron Microscopy*, 1981, pages 323–332, which use feedback techniques. There are other known systems such as that described in "The effect of passivation on the observation of voltage contrast in the scanning electron microscope", D. M. Taylor, *The Institute of Physics*, Vol. 11, 1978, pages 2443–2454; and "A voltage contrast detector for the SEM", Hardy et al., *Journal of Physics E: Scientific Instruments*, Vol. 8, Mar. 10, 1975, pages 789–793, which use the peak detection method. These known systems suffer from poor accuracy due to various error components like the potential barrier effect, off-normal incidence injection of secondary electrons into the analyzing field, lens effect, and analyzer geometry effects. These systems require a high extraction field (500 V/nm to 1000 V/nm) to minimize the error components due to local field effects (both Types I and II) acting on secondary electron trajectories. Unfortunately, the use of these high extraction fields is not compatible with certain sensitive specimens or with passivated specimens.

Furthermore, conventional systems cannot perform accurate voltage measurements on underlying structures in multi-level component systems due to errors from charging effects (e.g., in a multi-level component system where underlying metal structure may be exposed by focused ion beam milling with walls of insulator material surrounding the point of measurement).

SUMMARY OF THE INVENTION

An object of the present invention is to provide a method and apparatus for making quantitative voltage contrast measurements which overcomes the drawbacks of the conventional systems described above.

A further object of the present invention is to provide a method and apparatus for making quantitative voltage contrast measurements which use low extraction voltages and correct for errors due to local field effects (both Types I and II).

Another object of the present invention is to provide a method and apparatus for making quantitative voltage contrast measurements which correct for charging due to a contaminant layer forming as a result of a specimens exposure to air or under electron beam bombardment.

Another object of the present invention is to provide a method and apparatus for making quantitative voltage contrast measurements which perform accurate voltage measurements on underlying structures in a multi-level component system.

Another object of the present invention is to provide a lock-in-peak-detection quantitative voltage contrast measurement setup.

These and other related objectives are achieved by providing a method of measuring quantitative voltage contrast comprising the steps of: (a) outputting instructions from a processor to an energy analyzer and scanning electron microscope; (b) locating an electron beam of said scanning electron microscope on a specimen electrode of a specimen structure based on said instructions; (c) varying a grid voltage of said energy analyzer in accordance with said instructions; (d) detecting secondary electron emission from said specimen electrode with a detector of said scanning electron microscope; (e) determining a measured peak voltage of said specimen electrode based on output from said detector; (f) obtaining a specimen electrode voltage corrected for type I local field effect error using said measured peak voltage and a type I calibration curve, said type I calibration curve representing peak voltage versus specimen electrode voltage; and (g) correcting for type II local field effect error in the output of said step (f) based on a type II calibration curve, said type II calibration curve representing a shift in specimen electrode peak voltage versus adjacent electrode voltage.

The objectives of the present invention are also achieved by providing an apparatus for measuring quantitative voltage contrast comprising: means for outputting instructions to an energy analyzer and scanning electron microscope; means for locating an electron beam of said scanning electron microscope on a specimen electrode of a specimen structure based on said instructions; means for varying a grid voltage of said energy analyzer in accordance with said instructions; means for detecting secondary electron emission from said specimen electrode; means for determining a measured peak voltage of said specimen electrode based on output from said means for detecting; means for obtaining a specimen electrode voltage corrected for type I local field effect error using said measured peak voltage and a type I calibration curve, said type I calibration curve representing peak voltage versus specimen electrode voltage; and means for correcting for type II local field effect error in output of said means for obtaining based on a type II calibration curve, said type II calibration curve representing a shift in specimen electrode peak voltage versus adjacent electrode voltage.

These and other related objectives of the present invention will become more readily apparent from the detailed description given hereafter. It should, however, be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description here-in-below and the accompanying drawings which are given by way of illustration only, and thus do not limit the present invention.

The above-mentioned drawings will be described in detail in the following detailed description wherein like reference numerals identify like elements.

DETAILED DESCRIPTION OF THE PREFERRED EMBODIMENTS

Figure 5:
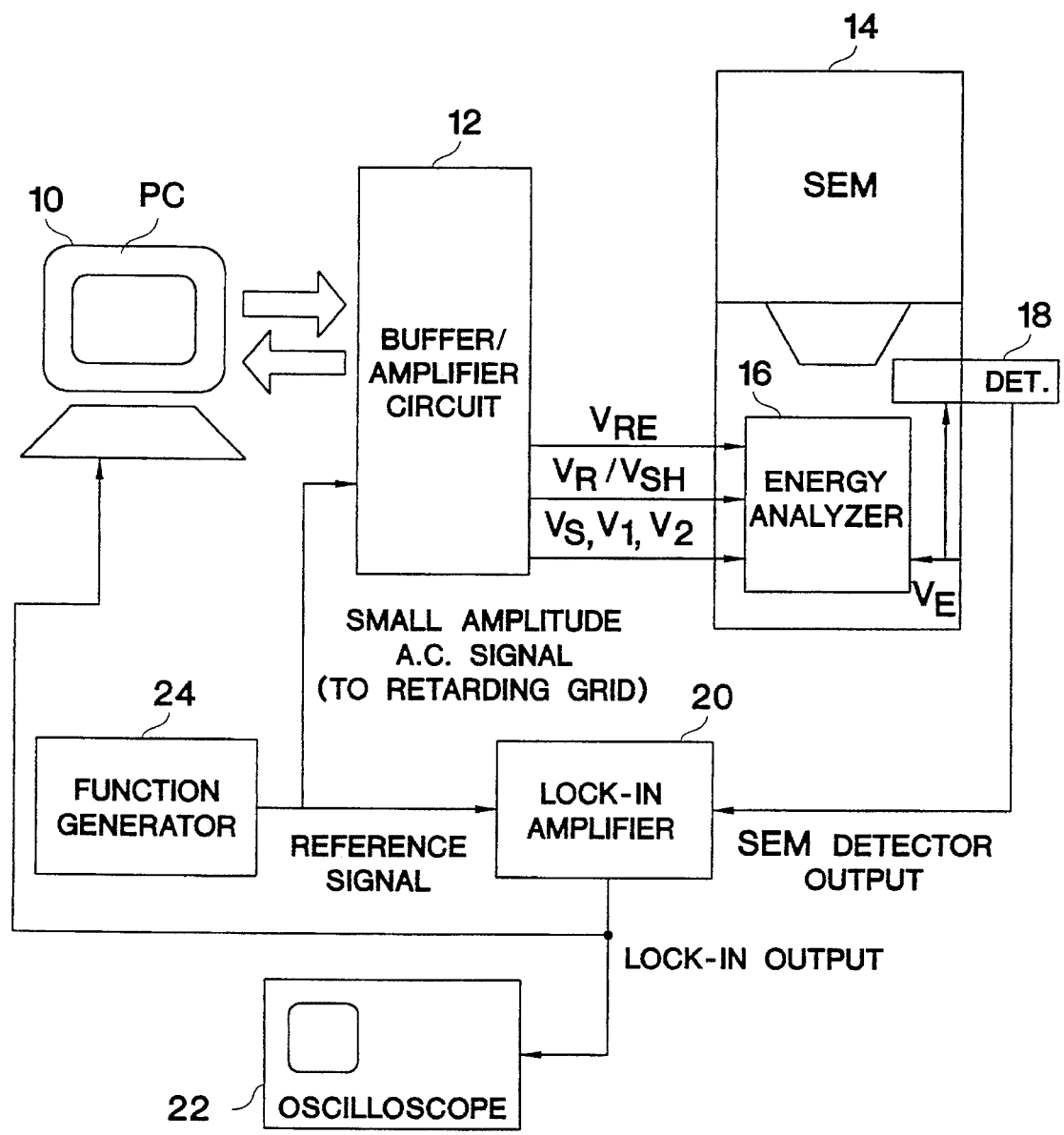
FIG. 5 is a block diagram of the measurement apparatus according to the present invention.

FIG. 5 illustrates an embodiment of a measurement apparatus of the present invention. In FIG. 5, reference numeral 10, represents a personal computer (PC) or equivalent thereto, reference numeral 12 represents a buffer/amplifier circuit, reference numeral 14 represents a scanning electron microscope (SEM), reference numeral 16 represents an energy analyzer, reference number 18 represents a detector, reference numeral 20 represents a lock-in amplifier, reference numeral 22 represents an oscilloscope, and reference numeral 24 represents a function generator.

The buffer/amplifier circuit 12 is connected to the PC 10, the energy analyzer 16, and the function generator 24. The function generator 24 is also connected to the lock-in amplifier 20. The lock-in amplifier 20 is further connected to the PC 10 and detector 18. In FIG. 5, the lock-in amplifier is shown connected to oscilloscope 22; however, this connection is optional.

The SEM 14 operates cooperatively with energy analyzer 16 and detector 18 under the control of PC 10 or a skilled operator. Specifically the PC 10 or the operator would control an X-Y table holding a specimen stage. The energy analyzer (or spectrometer) 16 used in the measurement apparatus can be a planar retarding field spectrometer, a hemispherical retarding field spectrometer, a collimating magnetic field spectrometer, or any commercially available spectrometer for voltage contrast measurements/electron beam testing.

Figure 6:
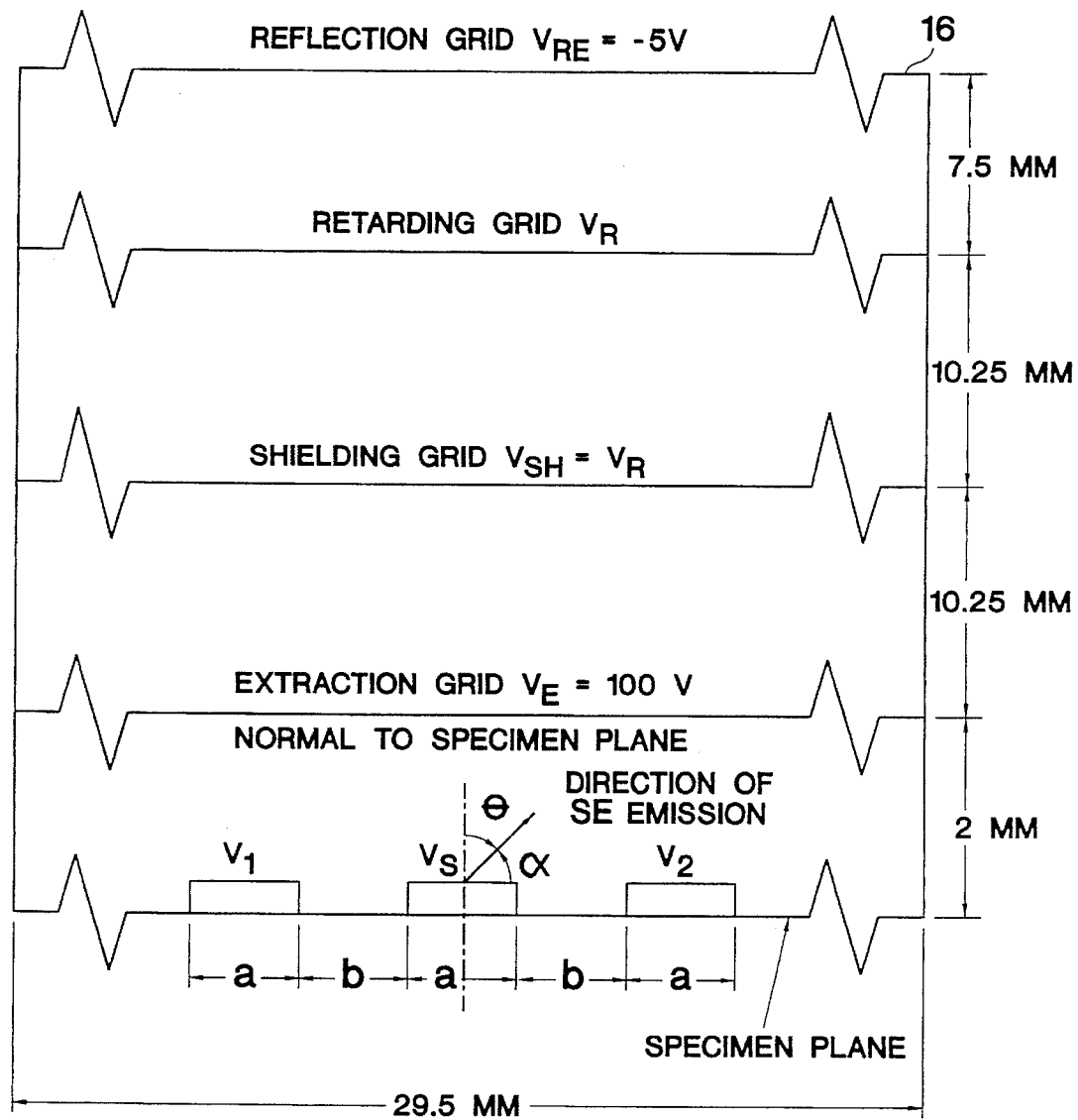
FIG. 6 is a schematic diagram of the energy analyzer according to the present invention.

A schematic diagram of the planar retarding field analyzer 16 used in the measurement apparatus of FIG. 5 is illustrated in FIG. 6. The energy analyzer 16 includes a reflection grid having a reflection grid voltage $V_{RE}$, a retarding grid having a retarding grid voltage $V_R$, a shielding grid having a shielding grid voltage $V_{SH}=V_R$, and an extraction grid having an extraction grid voltage $V_E$. Each of the above described grids are arranged parallel to one another and to a specimen plane, and are separated by predetermined distances. In the embodiment of the energy analyzer 16 shown in FIG. 6, the reflection grid is separated from the retarding grid by 7.5 mm, the retarding grid is separated from the shielding grid by 10.25 mm, the shielding grid is separated from the extraction grid by 10.25 mm, and the extraction grid is separated from the specimen plane by 2 mm. The specimen plane includes a specimen having a specimen electrode and adjacent electrodes.

FIG. 6 also shows that the grids have a width of 29.5 mm. For purposes of illustration, an electron beam represented by a dash-dot line is shown incident on specimen electrode $V_S$. The resulting secondary electrons are represented by a vector having an angle $\alpha$ with respect to the specimen plane and an angle $\theta$ with respect to the electron beam. Also shown in FIG. 6, the specimen and adjacent electrodes have a width of dimension a and are spaced apart by a distance b. The values of width a and space b will depend on the specimen being tested.

The PC 10 can be an IBM personal computer or other processing device which includes an analog-to-digital converter and a digital-to-analog converter for interfacing with the measurement apparatus. The buffer/amplifier circuit 12 receives instructions from the PC 10, and outputs the reflection grid, retarding grid, and shielding grid voltages $V_{RE}$, $V_R$, $V_{SH}$ to the energy analyzer 16 in accordance with the received instructions. The extraction grid voltage $V_E$ is tapped from the voltage supply for detector 2. In the embodiment shown in FIG. 6, during operation, the reflection grid voltage $V_{RE}$ is set to −5 v, the extraction grid voltage $V_E$ is set to 100 V, and the retarding grid voltage $V_R$, and thus the shielding grid voltage $V_{SH}$, are varied. Varying of the retarding grid voltage $V_R$ is discussed in detail below.

The buffer/amplifier circuit 12 also outputs voltages $V_S$, $V_1$, and $V_2$ to apply to the specimen and adjacent electrodes in accordance with the received instructions. The buffer/amplifier circuit 12 also receives, from the function generator 24, a small a.c. signal of about 400 mV peak-to-peak. The buffer/amplifier circuit 12 combines, in a summing circuit (not shown), the small a.c. signal with the d.c. retarding grid voltage generated in accordance with the instructions from the PC 10. The buffer/amplifier circuit 12 supplies the resulting signal to the energy analyzer 16 for biasing the retarding grid.

During operation, the SEM 14 directs an electron beam on the specimen electrode, and the detector 18, which can be a scintillator-photomultiplier detector or any other type of secondary electron (SE) detector, detects secondary electron emissions (See FIG. 6) from the specimen electrode. The detector 18 outputs to the lock-in amplifier 20 a voltage representing the detected secondary electrons. The lock-in amplifier 20 also receives the small a.c. signal from the function generator 24 as a reference signal. The lock-in amplifier 20 differentiates the curve representing the output of detector 18 versus the retarding grid voltage $V_R$. The output of the lock-in amplifier 20 corresponds to the energy distribution of secondary electron emissions. The shift in the peak of the secondary electron energy distribution provides information on the voltage of the electrodes. The retarding grid voltage $V_R$ where the output of the lock-in amplifier 20 is maximum indicates the peak of the secondary electron distribution. The lock-in amplifier 20 may be a commercially available lock-in amplifier such as the SR-530 Lock-in Amplifier from Stanford Research Systems.

The PC 10 receives the output of the lock-in amplifier 20, and measures the quantitative voltage contrast based thereon. The output of the lock-in amplifier 20 can also be monitored using oscilloscope 22.

The quantitative voltage contrast measurement performed by the measurement apparatus of FIG. 5 will now be described with reference to the flow charts of FIGS. 1–4(*c*).

Figure 1:
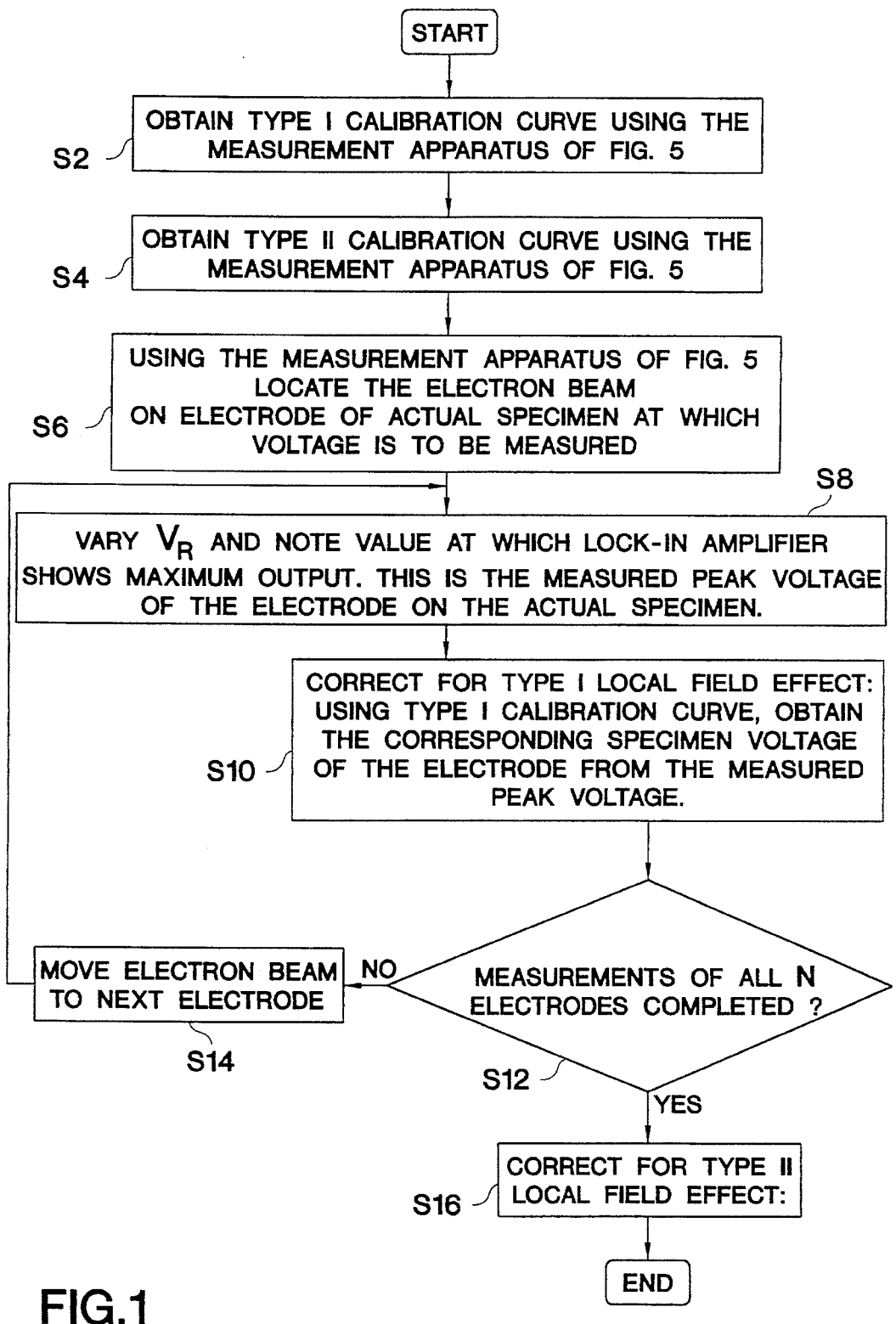
FIG. 1 is a flow chart illustrative of the method according to the present invention.

The flow chart of FIG. 1 shows the method for making quantitative voltage contrast measurements. In step S2 a Type I calibration curve is obtained. The Type I calibration curve, which is a plot of peak voltage versus specimen electrode voltage, will be used in later steps for correcting Type I local field effect errors.

Figure 2:
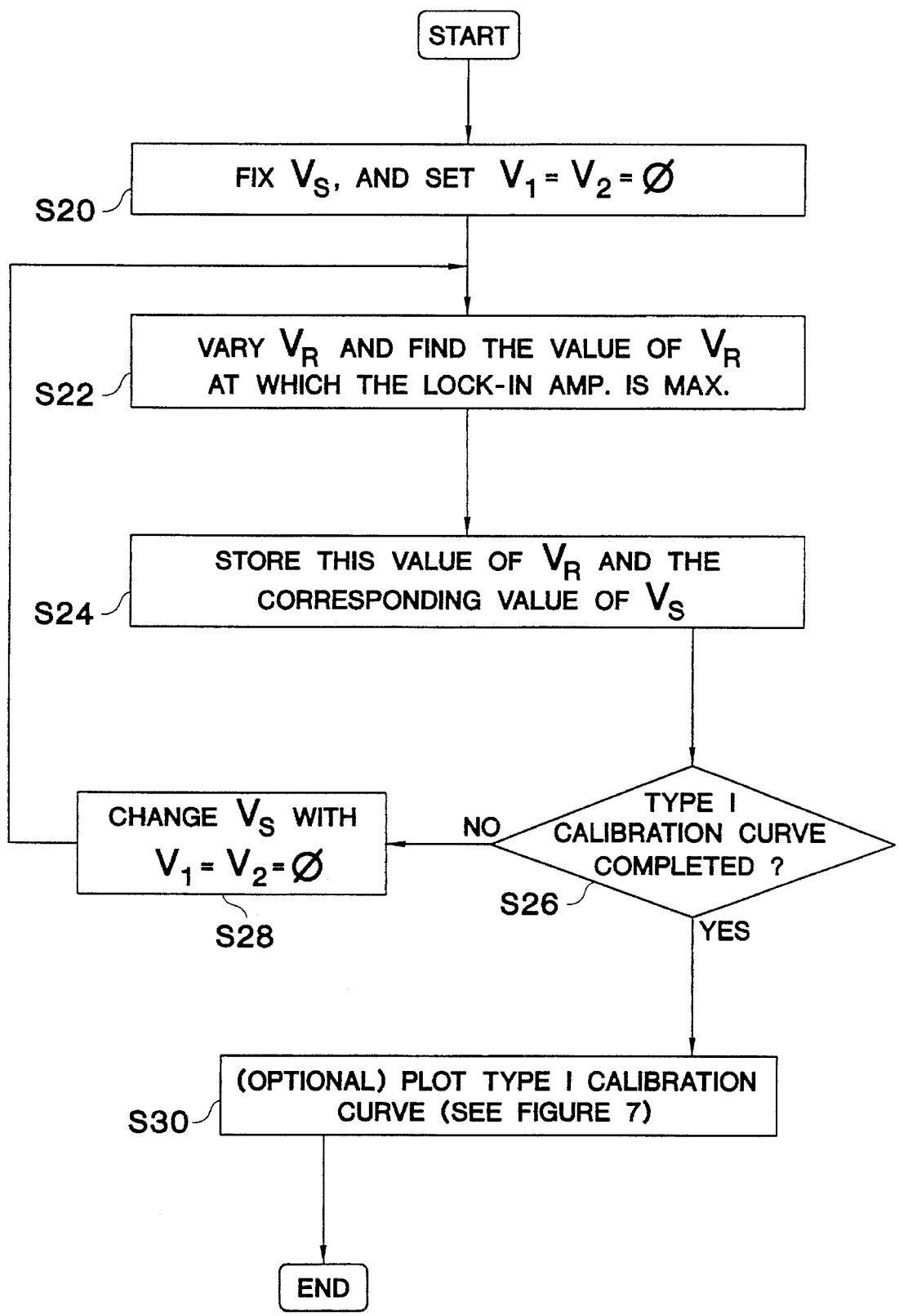
FIG. 2 is a flow chart illustrative of the method according to the present invention.
Figure 7:
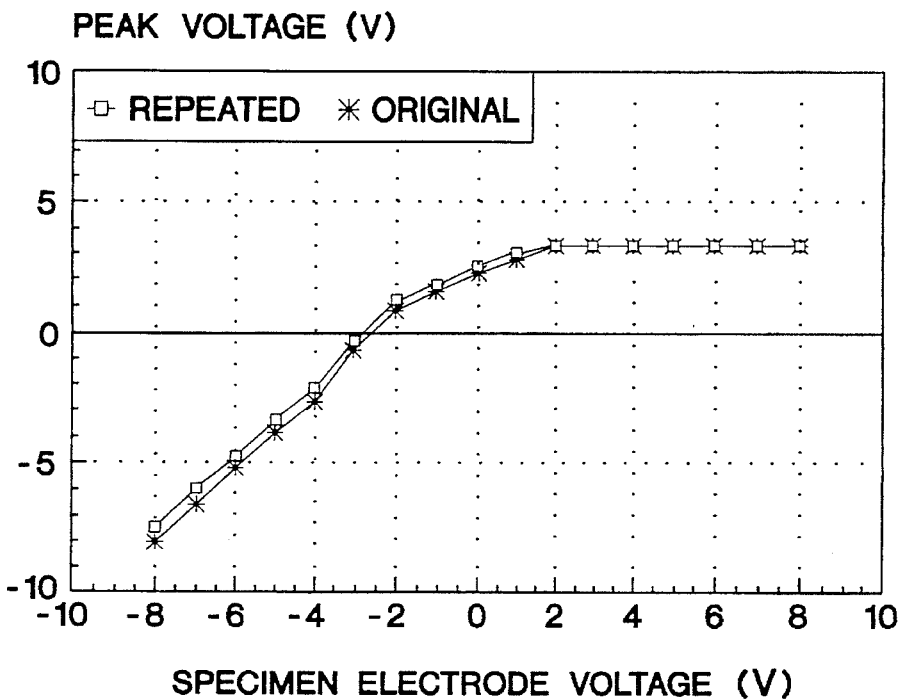
FIG. 7 is an example of a Type I calibration curve.

FIG. 2 is a flow chart showing the method for obtaining the Type I calibration curve. The description of the flow chart shown in FIG. 2 will be made in association with an example of a Type I calibration curve shown in FIG. 7. A three-electrode, unpassivated reference structure having approximately similar electrode width:spacing as the actual specimen structure, such as shown in FIG. 6, is placed in the energy analyzer 16. In obtaining the curve of FIG. 7, an unpassivated reference structure having an electrode width-:spacing of 10:5 microns was used. The specimen electrode voltage $V_S$ is fixed, and the adjacent electrode voltages $V_1$ and $V_2$ are set to zero in step S20. In FIG. 7, the specimen electrode voltage $V_S$ was initially set to −8 V.

The retarding grid voltage is then varied in step S22. In obtaining the calibration curve of FIG. 7, the retarding grid voltage $V_R$ was varied from 5 V to −20 V in increments of 0.5 V. A finer increment could be used depending on the resolution and accuracy required for the measurement. The PC 10 then stores in step S24 the value of $V_R$, when the output of the lock-in amplifier 20 is a maximum, along with the corresponding value of $V_S$. The stored value of the retarding grid voltage $V_R$ is the peak voltage at the specimen electrode voltage $V_S$.

The above steps S20–24 obtain one point on the Type I calibration curve. To obtain successive points, the above operations are repeated for different values of the specimen electrode voltage $V_S$. For instance, as shown in FIG. 7, the specimen electrode voltage was varied from −8 V to 8 V in increments of 1.0 V. Again, finer increments could be chosen depending on the desired accuracy and resolution. Thus, in step S26, it is determined whether the Type I calibration curve is completed (i.e., whether $V_S=8$ V for the example shown in FIG. 7). If, in step S26 it is determined that the Type I calibration curve is not completed, then in step S28, the value of the specimen voltage $V_S$ is changed according to the increments discussed above, and steps S20–24 are repeated.

If, in step S26 it is determined that the Type I calibration curve is completed, then step S2 is complete, or, as an option, in step S30 the PC 10 can plot the Type I calibration curve prior to the completion of step S2. For instance, the PC 10 could display on a display screen or output to a printer, the Type I calibration curve such as shown in FIG. 7. FIG. 7 further illustrates that the method of obtaining the Type I calibration curve can be repeated for the same reference structure to obtain a repeated Type I calibration curve. The repeated Type I calibration curve represents the shift in the repeated measurement from the original measurement due to positive charging of a contaminant layer which builds up on the surface of a structure (reference or specimen) as a result of prolonged electron beam bombardment and exposure to air.

As shown in FIG. 1, after obtaining the Type I calibration curve, the Type II calibration curve is obtained in step S4. The Type II calibration curve, which is a plot of the shifts in peak voltage of the specimen electrode versus adjacent electrode voltages, will be used in later steps to correct for Type II local field effects.

Figure 3:
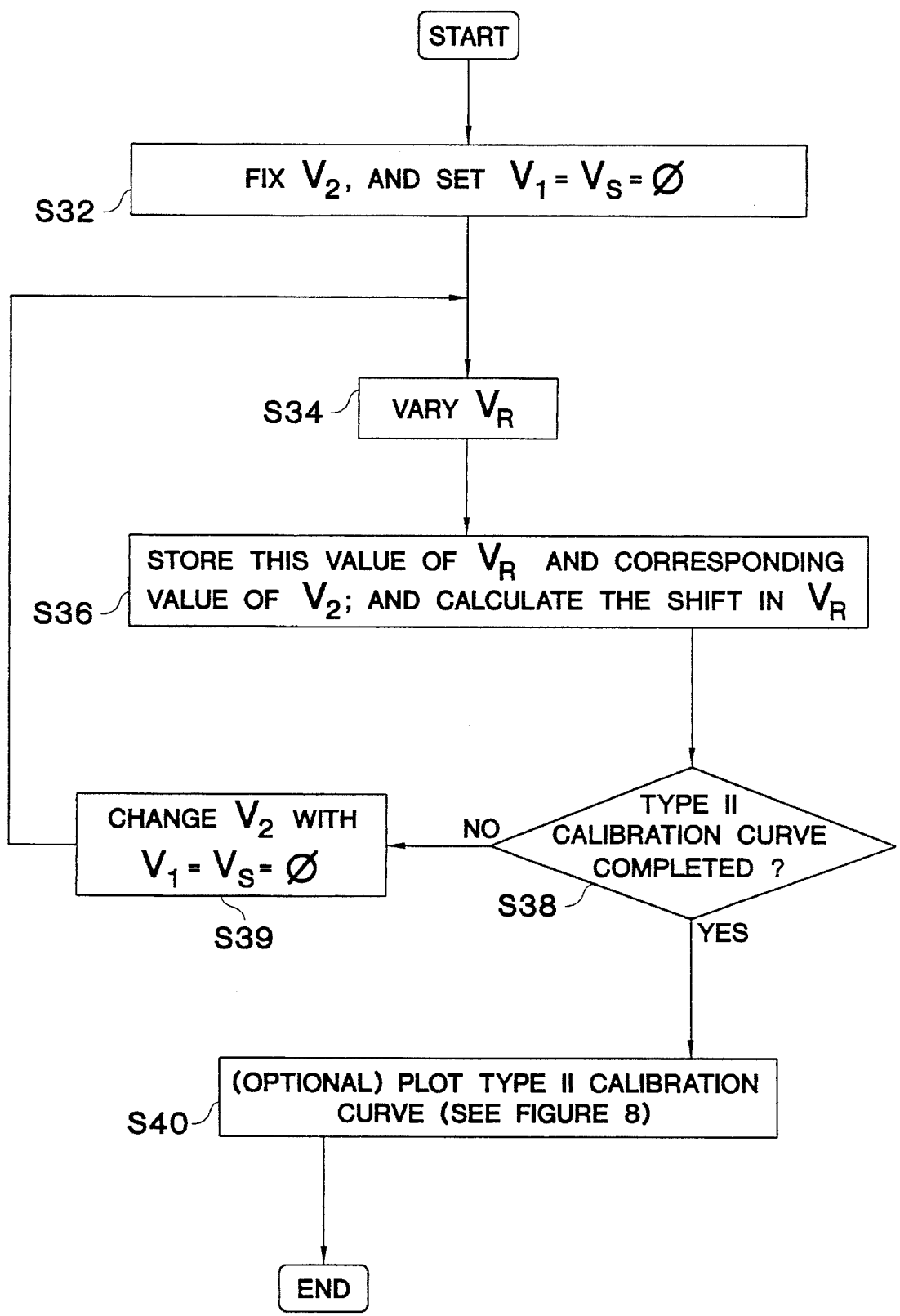
FIG. 3 is a flow chart illustrative of the method according to the present invention.
Figure 8:
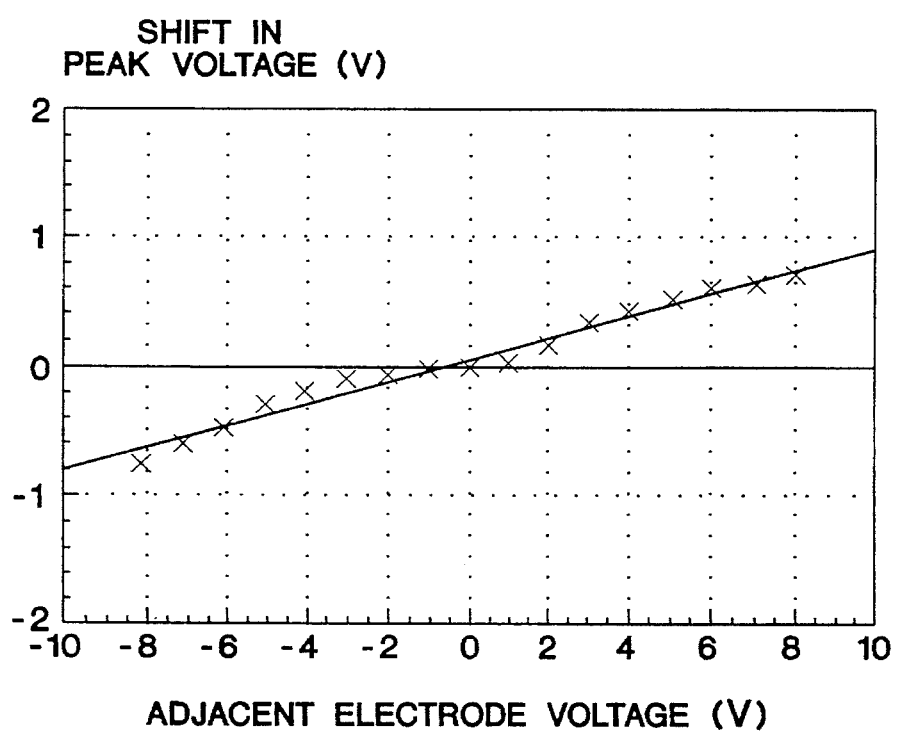
FIG. 8 is an example of a Type II calibration curve.

FIG. 3 is a flow chart showing the method for obtaining the Type II calibration curve. The description of the flow chart shown in FIG. 3 will be made in association with an example of a Type II calibration curve shown in FIG. 8. A three-electrode, unpassivated reference structure having approximately similar electrode width:spacing as the actual specimen structure, such as shown in FIG. 6, is placed in the energy analyzer 16. In obtaining the curve of FIG. 8, an unpassivated reference structure having an electrode width-:spacing of 10:5 microns was used. One of the adjacent electrode voltages $V_1$ and $V_2$ is fixed, and the other adjacent electrode voltage and the specimen electrode voltage $V_S$ are set to zero in step S32. For purposes of description, it will be assumed that adjacent electrode voltage $V_2$ is fixed. As shown in FIG. 8, the adjacent electrode voltage $V_2$ is initially fixed at −8 V. The retarding grid voltage $V_R$ is then varied in step S34.

The maximum range of variation for the retarding grid voltage is 5 to −50 V in incrememnts of 1 V. Typically, however, the range of 5 to −20 V at 0.5 V increments is used. As discussed above, the size of the increment can be changed to suit accuracy requirements. The range itself must simply be sufficient to obtain the peak of the secondary electron distribution. The above equally applies to obtaining the Type I calibration curve.

The PC 10 then stores in step S36 the value of $V_R$, when the output of the lock-in amplifier 20 is a maximum, as a measured voltage and stores the corresponding value of $V_2$. The PC 10 then determines the shift in the retarding grid voltage. This is accomplished by temporarily setting the adjacent electrode voltage to a base level, e.g. zero, and storing the output of the lock-in amplifier as a reference voltage. Afterwards, the adjacent electrode voltage $V_2$ is returned to its previous voltage level. The PC 10 then determines the shift in retarding grid voltage $V_R$ by subtracting the reference voltage from the measured voltage.

The above steps S32–36 obtain one point on the Type II calibration curve. To obtain successive points, the above operations are repeated for different values of the adjacent electrode voltage $V_2$. For instance, as shown in FIG. 8, the adjacent electrode voltage $V_2$ was varied from −8 V to 8 V in increments of 1.0 V. Thus, in step S38, it is determined whether the Type II calibration curve is completed (i.e., whether $V_2=8$ V for the example shown in FIG. 8). If, in step S38 it is determined that the Type II calibration curve is not completed, then in step S39, the value of adjacent electrode voltage $V_2$ is changed according to the increments discussed above, and steps S32–S36 are repeated.

If, in step S38 it is determined that the Type II calibration curve is completed, then step S4 is complete, or, as an option, in step S40 the PC 10 can plot the Type II calibration curve prior to the completion of step S4. For instance, the PC 10 could display on a display screen or output to a printer, the Type II calibration curve as shown in FIG. 8.

After obtaining the Type II calibration curve, an actual specimen structure is located within the energy analyzer 16, and quantitative voltage contrast measurements, corrected for Type I local field effects, are made for N electrodes of the actual specimen structure. The number of electrodes to be measured, N, varies depending on the specimen, and each of the N electrodes are treated in turn as the specimen electrode.

The SEM 14 locates the electron beam on a specimen electrode in step S6. Then in step S8, the retarding grid voltage $V_R$ is varied such as was described in obtaining the Type I and II calibration curves, the output of the lock-in amplifier 20 is monitored, and the PC 10 determines the measured peak voltage of the specimen electrode as the retarding grid voltage $V_R$ corresponding to the maximum output of the lock-in amplifier S20.

Next, in step S10, the PC 10 obtains a quantitative voltage contrast measurement of the specimen electrode corrected for Type I local field effects by reading, from the stored Type I calibration curve (see FIG. 7), the specimen electrode voltage corresponding to the measured peak voltage. If a peak voltage of the Type I calibration curve does not match the measured peak voltage, then the PC 10 interpolates the specimen electrode voltage based on the Type I calibration curve values greater than and less than the measured peak voltage. While the embodiment described herein uses linear interpolation, applicants contemplate the use of non-linear interpolation techniques. Alternatively, curve fitting techniques could be used. The above comments apply equally to all interpolation performed by the present invention, and, therefore, will not be repeated.

The PC 10 further monitors the period of time the actual specimen structure undergoes electron beam bombardment and exposure to air. When the period of time exceeds a predetermined threshold, the PC 10 determines whether there is a positive charging present, due to the buildup of a contaminant layer on the specimen surface, by repeating the Type I calibration curve measurement and noting any significant shifts in the repeated calibration curve from the original calibration curve. Accordingly, in determining the measured peak voltage for the remaining electrodes of the actual specimen structure, the PC 10 uses the repeated Type I calibration curve in the same manner as the Type I calibration curve.

The number of electrodes N depends on the actual specimen structure, and in step S12, it is determined whether all N electrodes have undergone the measurements of steps S8 and S10. If the answer in step S12 is no, then in step S14, the SEM 14 locates the electron beam on the next electrode to be measured as the specimen electrode. Steps S8 and S10 are then repeated for the new specimen electrode.

Figure 4A:
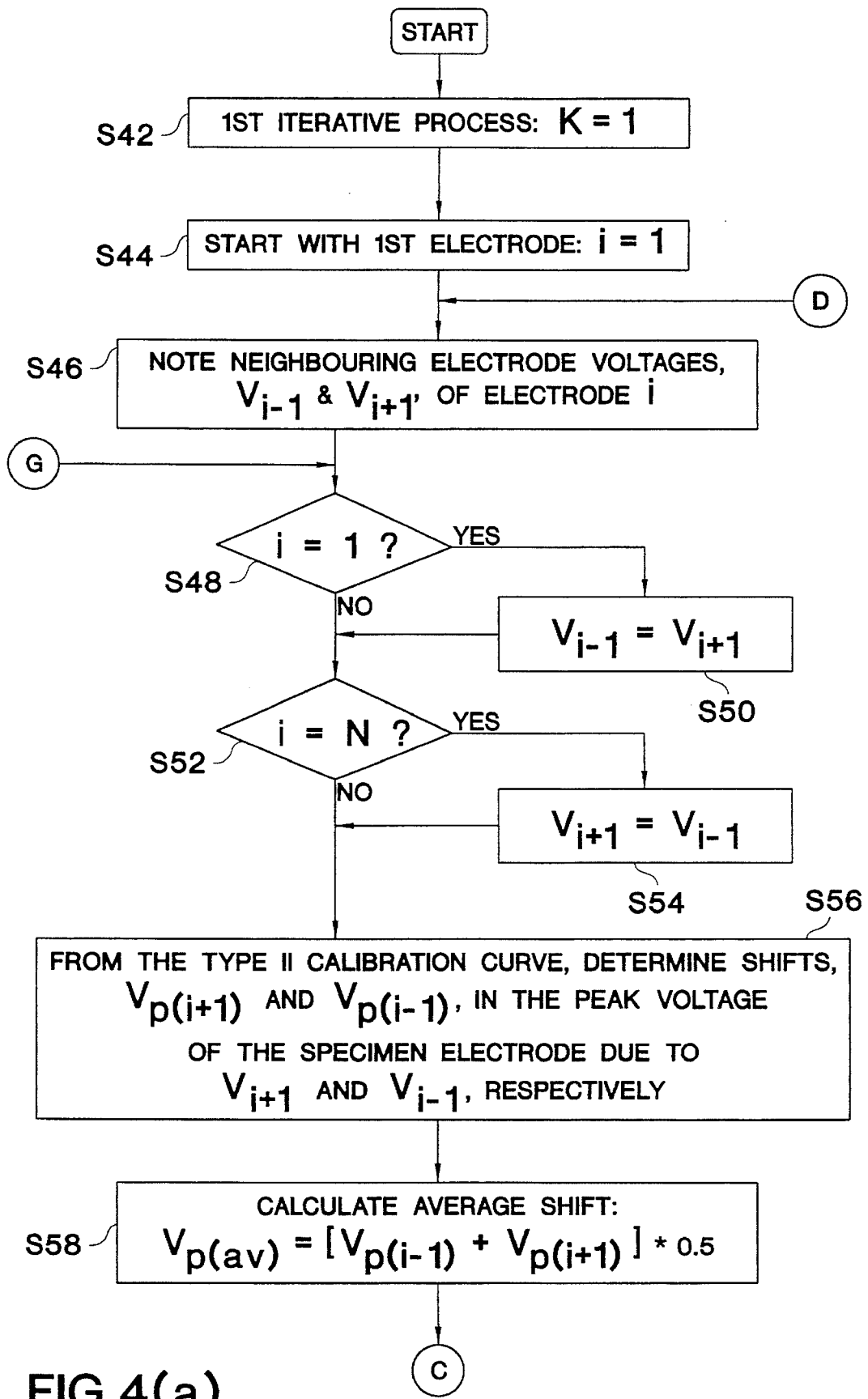
FIG. 4(a) is a flow chart illustrative of the method according to the present invention.
Figure 4B:
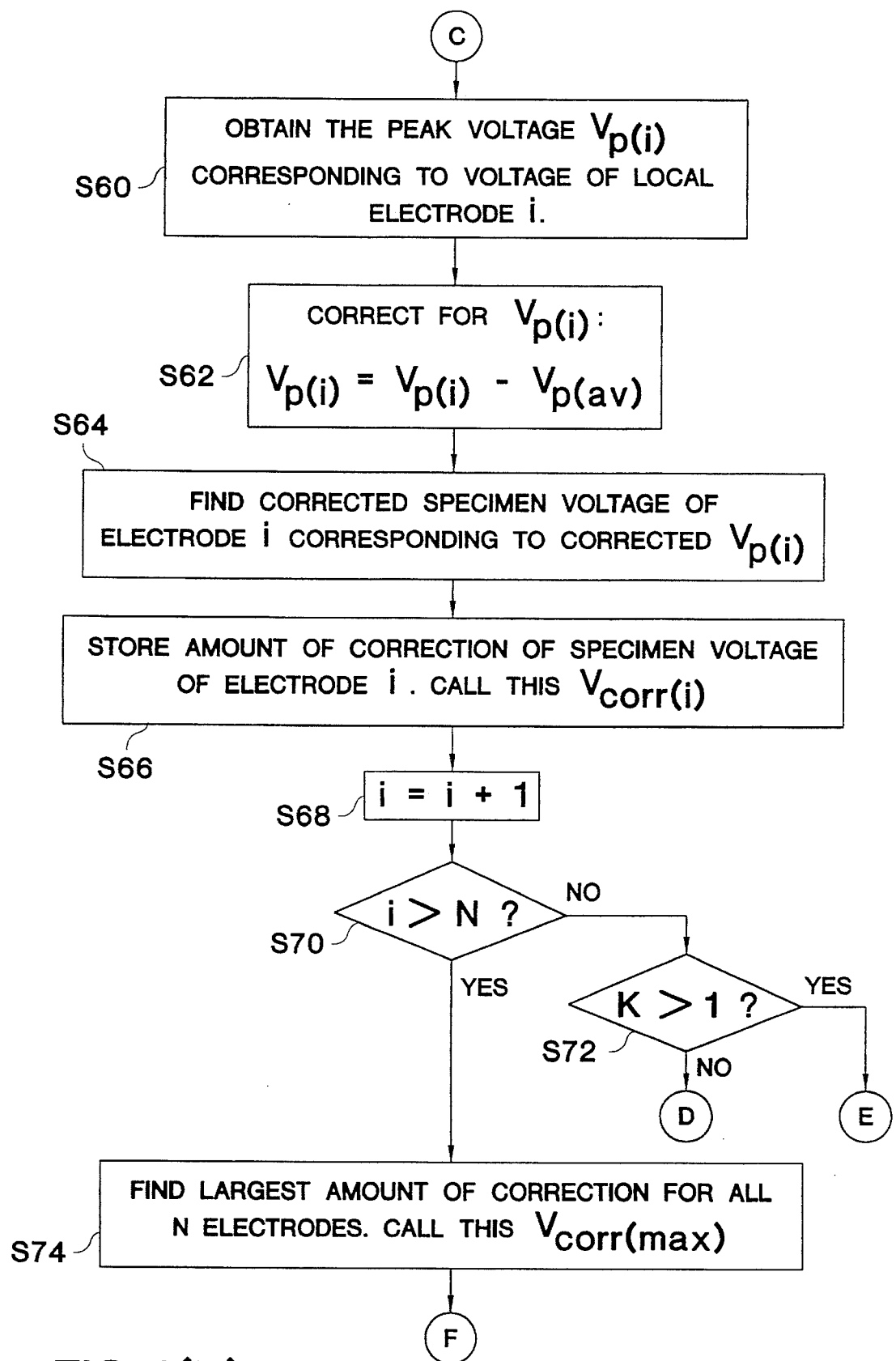
FIG. 4(b) is a flow chart illustrative of the method according to the present invention.
Figure 4C:
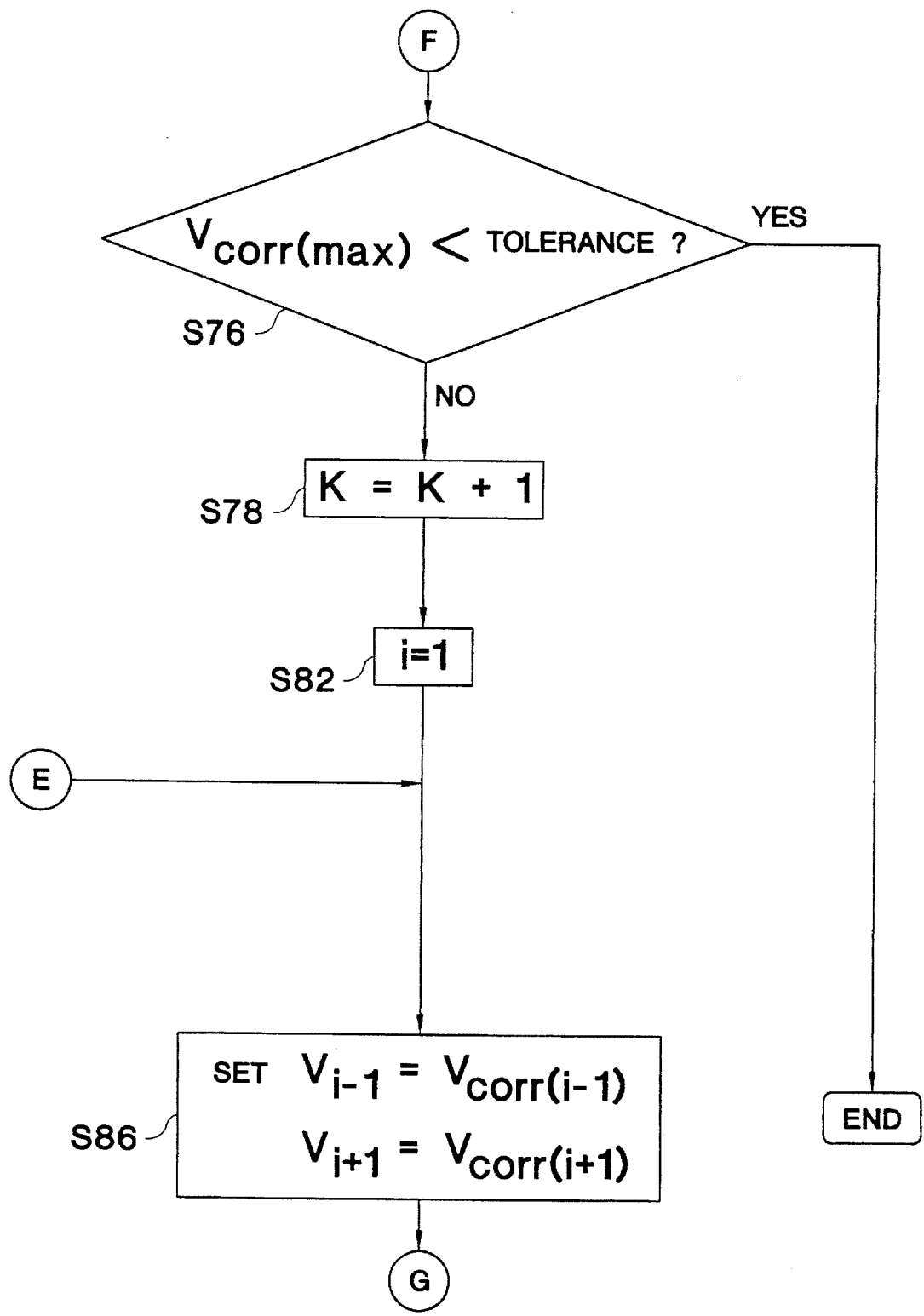
FIG. 4(c) is a flow chart illustrative of the method according to the present invention.

If the answer in step S12 is yes, then in step S16, PC 10 corrects for the Type II local field effect on the quantitative voltage contrast measurements. FIGS. 4(a)–4(c) are flow charts showing in greater detail the steps comprising step S16. The correction scheme for Type II local field effects, elaborated in the flow chart of FIGS. 4(a)–4(c), includes two iterative processes.

In the first iterative process, the voltages of the adjacent electrodes for each of the N electrodes are examined, and the shift in the peak voltage due to the voltages of the adjacent electrodes are determined for each of the N electrodes using the Type II calibration curve. The PC 10 then determines a corrected peak voltage for each of the N electrodes using the determined shifts in the peak voltage, and determines the actual N specimen electrode voltages therefrom. If the largest peak voltage correction amount falls below a predetermined tolerance (i.e. achieves a desired measurement accuracy), then the quantitative voltage contrast measurement process ends; otherwise, the PC 10 begins a second iterative process.

The second iterative process differs from the first iterative process in that the peak voltage correction amounts of the adjacent electrodes are used, instead of the voltages of the adjacent electrodes, to determine the shifts in the peak voltage for each of the N electrodes. The remainder of the quantitative voltage contrast measurement process continues as in the first iterative process. If, however, the largest peak voltage correction amount of the second iterative process exceeds the predetermined tolerance, the second iterative process is repeated, and will only terminate upon reaching the desired measurement accuracy. Each successive iteration of the second iterative process uses the peak voltage correction amounts of the previous iteration of the second iterative process.

The first and second iterative process will now be described in detail with respect to FIGS. 4(a)–4(c). At the beginning of step S16, since this is the beginning of the first iterative process, iterative process counter K is set to one in step S42. Then, in step S44 the specimen electrode counter i is set to one.

In step S46, the PC 10 accesses the specimen electrode voltages $V_{i+1}$ and $V_{i-1}$ determined in step S10 for electrodes $i+1$ and $i-1$, respectively, adjacent to electrode i. Then, in step S48 the PC 10 determines whether i equals one. If i equals one, then PC 10 sets, in step S50, the voltage $V_{i-1}$ of electrode $i-1$ equal to the voltage $V_{i+1}$ of electrode $i+1$ because electrode $i-1$ does not exist.

After step S50, or if i does not equal 1, the PC 10 determines, in step S52, if i equals N (the total number of electrodes). If i equals N, then PC 10 sets, in step S54, the voltage $V_{i+1}$ of electrode $i+1$ equal to the voltage $V_{i-1}$ of electrode $i-1$ because electrode $i+1$ does not exist.

The PC 10 determines, in step S56, the shifts, $V_{p(i+1)}$ and $V_{p(i-1)}$, in the peak voltage of the specimen electrode due to the voltages $V_{i+1}$ and $V_{i-1}$ of the adjacent electrodes using voltages $V_{i+1}$ and $V_{i-1}$ and the Type II calibration curve. Shifts in the peak voltage of the specimen electrode, $V_{p(i+1)}$ and $V_{p(i-1)}$, are read from the Type II calibration curve using the adjacent electrode voltages $V_{i+1}$ and $V_{i-1}$, respectively. If a peak voltage of the Type II calibration curve does not match the measured peak voltage, then the PC 10 interpolates the shift in specimen electrode peak voltage based on the Type II calibration curve values greater than and less than the measured peak voltage.

Then in step S58, PC 10 determines the average shift $V_{p(av)}$ according to the following equation:

$$V_{p(av)} = (V_{p(i-1)} + V_{p(i+1)}) * 0.5 \qquad (1)$$

In step S60 the PC 10 accesses the specimen electrode voltage $V_i$ determined in step S10 corresponding to electrode i, and reads the peak voltage $V_{p(i)}$ corresponding to the voltage $V_i$ from the Type I calibration curve. As described previously, PC 10 interpolates to determine the peak voltage $V_{p(i)}$ when the Type I calibration curve does not match the voltage $V_i$.

In step S62, the PC 10 corrects the peak voltage $V_{p(i)}$ corresponding to voltage $V_i$ by subtracting the average shift $V_{p(av)}$ from the peak voltage $V_{p(i)}$. The PC 10 then reads, in step S64, the corrected specimen electrode voltage for electrode i from the Type I calibration curve using the corrected peak voltage $V_{p(i)}$.

In step S66, the PC 10 determines and stores the amount of correction $V_{corr(i)}$ of the specimen electrode voltage for electrode i. The amount of correction $V_{corr(i)}$ is determined by subtracting the specimen electrode voltage $V_i$ for electrode i in step S60 from the corrected specimen electrode voltage for electrode i determined in step S64.

In step S68 the specimen electrode counter i is incremented by one, and in step S70 PC 10 determines whether all N electrodes have undergone the measurement steps of S46–S66 (i.e., is i>N?).

If the answer to step S70 is yes, the PC 10 determines which of the correction amounts, $V_{corr}$, for the N electrodes is largest, $V_{corr(max)}$, in step S74. Then in step S76 the PC 10 determines if $V_{corr(max)}$ is less than a predetermined tolerance value. The tolerance value will depend on the accuracy required for the corrected specimen voltage and the computation time incurred in performing the correction scheme. This value is also dependent on the increment step size chosen for the retarding grid voltage $V_R$ (typically not more than an order of magnitude smaller than the increment), as it will not make sense to correct the voltage to an accuracy which the calibration process is not able to give (again this depends on the accuracy of the interpolation in reading values from the stored calibration curves). If the answer in step S76 is yes, then the corrected specimen electrode voltages for the N electrodes determined in step S64 are determined as the quantitative voltage contrast measurements.

If the answer in step S76 is no, then the second iterative process begins with incrementing the iterative process counter K in step S78, setting the measurement electrode counter to one in step S82, setting the specimen electrode voltage for electrode i+1 equal to the correction amount $V_{corr(i+1)}$ for electrode i+1 in step S86, and setting the specimen electrode voltage for electrode i−1 equal to the correction amount $V_{corr(i-1)}$ for the electrode i−1 also in step S86.

After step S86 the second iterative process beings measurement processing at step S48.

If the answer in step S70 is no, then in step S72 it is determined if the iterative process counter K is greater than one. If the answer to step S72 is yes, then second iterative processing continues beginning at step S86. If the answer to step S72 is no, then first iterative processing continues beginning at step S46.

Figure 9:
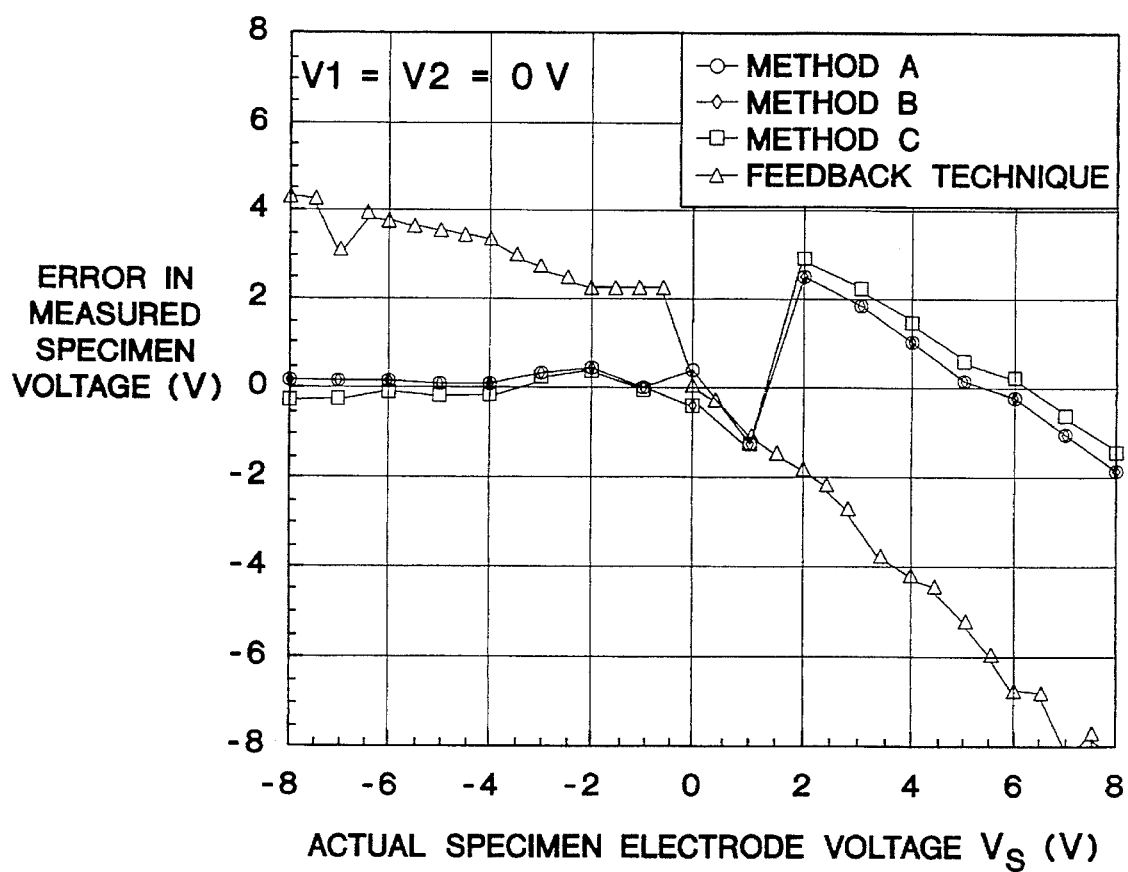
FIG. 9 is a graph of the error in the measured specimen electrode voltage versus the actual specimen electrode voltage.

FIG. 9 is a graph of the error in the measured specimen electrode voltage, as to Type I local field effects only, versus the actual specimen voltage $V_S$ with the adjacent electrode voltages set to zero. FIG. 9 provides a comparison between the conventional feedback technique and three methods (A, B, and C) according to the present invention.

Method A is the method just described above with respect to FIGS. 1–4(c) (i.e., Neumann boundary conditions are used). Method B is the same as method A except that in step S50, $V_{i-1}$ is set to zero and in step S54, $V_{i+1}$ is set to zero (i.e., Dirichlet boundary conditions). Method C is also the same as method B except that step S86 is omitted. As seen from FIG. 9, the present invention provides for greatly increased accuracy in measuring quantitative voltage contrast.

Figure 10:
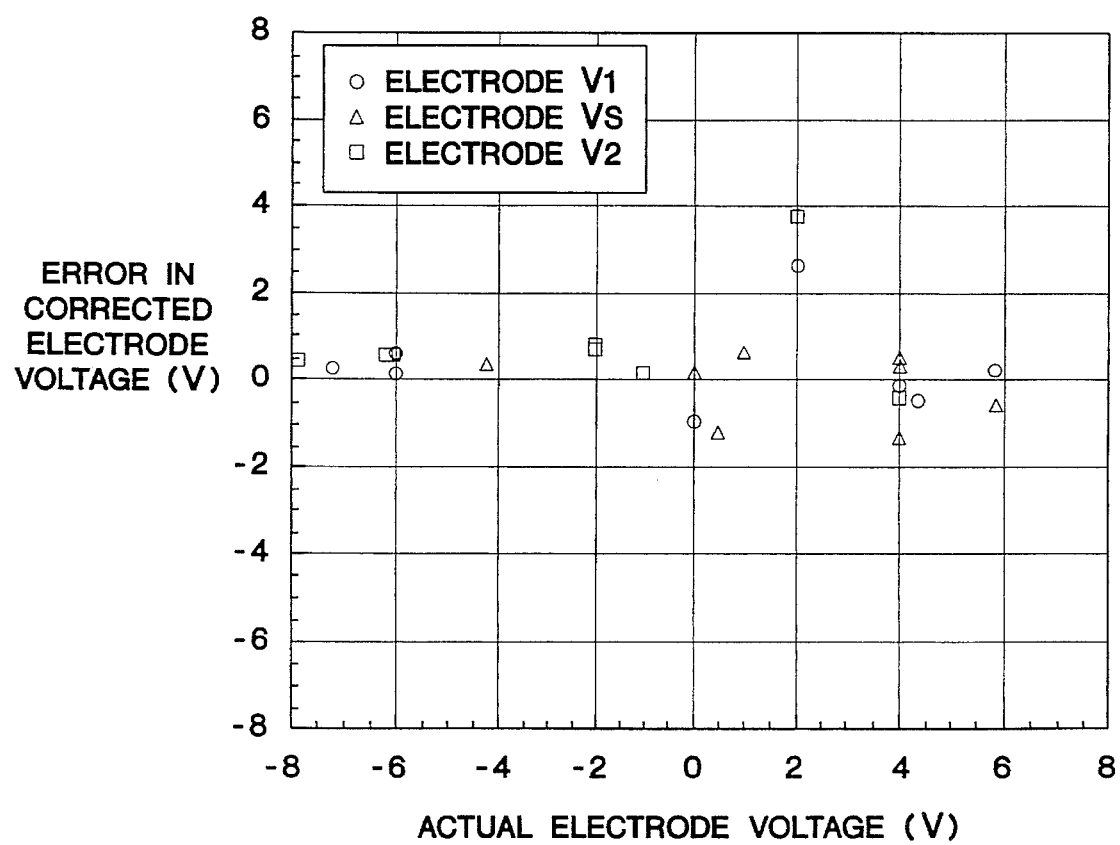
FIG. 10 is a scatter plot of the error on the electrode voltage versus the actual voltage for specimen and adjacent electrodes.

FIG. 10 is a scatter plot showing the error in the measured electrode voltage, when both Type I and Type II local field effects are present, versus the actual electrode voltage for the specimen and adjacent electrodes when method B is followed. As with FIG. 9, FIG. 10 illustrates the accuracy obtained by the present invention in quantitative voltage contrast measurements.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

We claim:

1. A method of measuring quantitative voltage contrast comprising the steps of:

(a) outputting instructions from a processor to an energy analyzer and scanning electron microscope;

(b) locating an electron beam of said scanning electron microscope on a specimen electrode of a specimen structure based on said instructions;

(c) varying a grid voltage of said energy analyzer in accordance with said instructions;

(d) detecting secondary electron emission from said specimen electrode with a detector of said scanning electron microscope;

(e) determining a measured peak voltage of said specimen electrode based on output from said detector;

(f) obtaining a specimen electrode voltage corrected for type I local field effect error using said measured peak voltage and a type I calibration curve, said type I calibration curve representing peak voltage versus specimen electrode voltage; and (g) correcting for type II local field effect error in output of said step (f) based on a type II calibration curve, said type II calibration curve representing a shift in specimen electrode peak voltage versus adjacent electrode voltage.

2. The method of claim 1, wherein said step (c) varies a grid voltage of a retarding grid of said energy analyzer.

3. The method of claim 1, further comprising the steps of:

(h) preparing said type I calibration curve; and (i) preparing said type II calibration curve.

4. The method of claim 3, wherein said step (h) comprises the steps of:

(h1) providing a three-electrode, unpassivated reference structure, said three electrodes including a center electrode and two adjacent electrodes;

(h2) applying, via said energy analyzer, a fixed voltage to said center electrode and a zero voltage to said two adjacent electrodes based on said instructions;

(h3) varying said grid voltage in accordance with said instructions;

(h4) determining a reference peak voltage based on output from said detector;

(h5) storing said reference peak voltage with respect to said fixed voltage.

5. The method of claim 3, wherein said step (i) comprises the steps of:

(i1) providing a three-electrode, unpassivated reference structure, said three electrodes including a center electrode and a first and second adjacent electrode adjacent to said center electrode;

(i2) applying, via said energy analyzer, a fixed voltage to said first adjacent electrode and a zero voltage to said center electrode and said second adjacent electrode based on said instructions;

(i3) varying said grid voltage in accordance with said instructions;

(i4) determining a reference peak voltage based on output from said detector;

(i5) temporarily setting said first adjacent electrode to a base voltage;

(i6) measuring a base peak voltage using output from said detector;

(i7) subtracting said base peak voltage from said reference peak voltage to obtain said reference peak voltage shift; and (i8) storing said reference peak voltage shift with respect to said fixed voltage.

6. The method of claim 1, wherein said step (e) comprises the steps of:

(e1) producing a curve of output from said step (d) versus said grid voltage; and (e2) determining said peak voltage as an inflection point in said curve.

7. The method of claim 4, wherein said step (h4) comprises the steps of:

(h41) producing a curve of output from said detector versus said grid voltage; and (h42) determining said reference peak voltage as an inflection point in said curve.

8. The method of claim 5, wherein said step (i4) comprises the steps of:

(i41) producing a curve of output from said detector versus said grid voltage; and (i42) determining said reference peak voltage as an inflection point in said curve.

9. The method of claim 1, wherein said step (f) includes the step of reading said specimen electrode voltage from said type I calibration curve using said measured peak voltage.

10. The method of claim 1, wherein said step (g) comprises the steps of:

(g1) calculating an average peak voltage shift for said specimen electrode using said type II calibration curve;

(g2) reading a peak voltage of said specimen electrode from said type I calibration curve using said specimen electrode voltage;

(g3) correcting said read peak voltage using said average peak voltage shift to produce a corrected peak voltage; and (g4) reading a corrected specimen electrode voltage from said type I calibration curve using said corrected peak voltage.

11. The method of claim 10, wherein said step (g1) includes the steps of:

(g11) obtaining a first and a second specimen electrode voltage for a first and a second electrode adjacent to said specimen electrode, respectively;

(g12) reading first and second peak voltage shifts corresponding to said first and second specimen electrode voltages from said type II calibration curve; and (g13) calculating an average of said first and second peak voltages shifts.

12. The method of claim 10, wherein said step (g3) includes the step of (g31) subtracting said average peak voltage shift from said read peak voltage shift.

13. The method of claim 1, wherein said step (g) comprises the steps of:

(g1) reading, from said type II calibration curve, a first and second peak voltage shift corresponding to a first and second electrode adjacent said specimen electrode; and (g2) calculating an average peak voltage shift for said specimen electrode using said first and second peak voltage shifts;

(g3) reading a peak voltage of said specimen electrode from said type I calibration curve using said specimen electrode voltage;

(g4) correcting said read peak voltage using said average peak voltage shift to produce a corrected peak voltage; and (g5) reading a corrected specimen electrode voltage from said type I calibration curve using said corrected peak voltage.

14. The method of claim 13, wherein each electrode of said specimen structure is treated as a specimen electrode, and further comprising the step of:

(h) repeating steps (b), (c), (d), (e) and (f) for each electrode of said specimen structure; and (i) repeating step (g) for each electrode of said specimen structure.

15. The method of claim 14, wherein said step (g) further includes the step of (g6) determining a correction amount for said specimen electrode; and further comprising the step of, (j) determining a maximum one of said correction amounts;

(k) comparing output of said step (j) to a threshold amount; and (l) re-correcting for said type II local field effect error in output of said step (g5) based on a result of said step (k).

16. The method of claim 15, wherein said step (g6) includes the step of (g61) subtracting the specimen electrode voltage from the corrected specimen electrode voltage.

17. The method of claim 15, wherein said step (l) comprises the steps of:

(l1) setting said first and second peak voltage shifts equal to said correction amount for said first and second electrodes adjacent said specimen electrode; and (l2) repeating steps (g1)–(g5).

* * * * *

UNITED STATES PATENT AND TRADEMARK OFFICE
CERTIFICATE OF CORRECTION

PATENT NO. : 5,486,769
DATED : January 23, 1996
INVENTOR(S) : W. K. Chin, et al.

It is certified that error appears in the above-indentified patent and that said Letters Patent is hereby corrected as shown below:

On title page, item [73], should read as follows:

Change "Crescent, Singapore" to --Kent Ridge Crescent, Singapore--

Signed and Sealed this

Seventeenth Day of September, 1996

Attest:

BRUCE LEHMAN

Attesting Officer   Commissioner of Patents and Trademarks